United States Patent [19]

Yung-Kuk et al.

[11] Patent Number: 5,198,087
[45] Date of Patent: Mar. 30, 1993

[54] METHOD OF MAKING MAGNETO-OPTICAL RECORDING MEDIUM

[75] Inventors: Jo Yung-Kuk, Chungnam; Jo Yong In, Kyongki; Yang Chang Sun, Chungnam, all of Rep. of Korea

[73] Assignee: SKC Limited, Kyongki, Rep. of Korea

[21] Appl. No.: 603,950

[22] Filed: Oct. 25, 1990

[30] Foreign Application Priority Data

Oct. 31, 1989 [KR] Rep. of Korea ............. 89-15747

[51] Int. Cl.$^5$ .................. C23C 14/34; G11B 7/26
[52] U.S. Cl. .................. 204/192.3; 204/192.2; 204/192.26
[58] Field of Search ............ 204/192.2, 192.26, 192.3; 156/643; 428/694, 900

[56] References Cited

U.S. PATENT DOCUMENTS 4,832,980 5/1989 Ichihara et al. ............ 427/38
4,892,634 1/1990 Glocker et al. ............ 204/192.15

Primary Examiner—Aaron Weisstuch
Attorney, Agent, or Firm—Quarles & Brady

[57] ABSTRACT

A process for preparing a magneto-optical recording medium is disclosed in which a recording layer is formed from a vertical magnetizing film made of amorphous metal having a magnetization facilitating axis in a vertical direction on a substrate material. A protective film layer of a metal or semi-metal oxide, nitride or sulphide as a main ingredient is formed on the recording layer in a vacuum chamber, and the surface energy of the protective film is raised by etching it with plasma. The close adhesion of a next applied photosetting resin layer is thereby improved.

1 Claim, 3 Drawing Sheets

- ● EXAMPLE 1
- × EXAMPLE 2
- ○ EXAMPLE 3
- ■ EXAMPLE 4
- △ COMPARATIVE EXAMPLE 1
- ▽ COMPARATIVE EXAMPLE 2
- □ COMPARATIVE EXAMPLE 3

- ● EXAMPLE 1
- × EXAMPLE 2
- ○ EXAMPLE 3
- ■ EXAMPLE 4
- △ COMPARATIVE EXAMPLE 1
- ▽ COMPARATIVE EXAMPLE 2
- □ COMPARATIVE EXAMPLE 3

METHOD OF MAKING MAGNETO-OPTICAL RECORDING MEDIUM

BACKGROUND OF THE INVENTION

1. Field of Invention

The present invention relates to a magneto-optical recording medium which performs data writing, erasing and rewriting using rays of light, and to a method of manufacturing the medium. More particularly, the invention relates to an improvement of environmental resistance by strengthening the close adhesion of the protective film to the photosetting resin through plasma etching after it is formed, to strengthen the environmental resistance of a metal film.

2. Description of the Prior Art

In a conventional magneto-optical recording medium, a vertical magnetizing film is usually formed on the recording layer by using an amorphous metallic material, such as Tb-Fe, Tb-Fe-Co, Gd-Fe-Co or Gd-Co.

However, as the recording layer contains a rare-earth metallic element, such as Tb or Gd, it is easily oxidized by moisture or oxygen in the air, such that the Kerr angle of rotation, the Faraday angle of rotation, magnetic resistance, transmissivity or reflexibility undergoes a great change, and angular formation of the Kerr hysteresis loop and faraday hysteresis loop characteristics become relatively poor. Consequently, the recording layer is unable to keep the properties of photomagnetism on a stabilized basis, and is thereby impractical for use as a medium which will keep data for many hours.

It is a generally known method to add an element, such as Pt, Ti, Cr, or Al, to the substance on the recording layer or to form a protective film by continuous sputtering or vacuum evaporation of a nitride, a sulphide or an oxide, such as $Si_3N_4$, AlN, ZnS, or $SiO_2$, on the recording layer in the vacuum tank in order to solve such a problem as described above.

When the above method is put to practical use, a drop in environmental resistance or oxidization resistance is shown. Consequently, photosetting resin which is not pervious to air and moisture is applied to the protective layer.

SUMMARY OF THE INVENTION

In existing magneto-optical recording media, the photosetting resin layer applied to the protective layer formed from nitride or sulphide does not adhere closely to a nitride or a sulphide, so that it is removed as time goes by and the environmental resistance deteriorates.

Therefore, the object of the present invention is to provide a magneto-optical recording medium with excellent environmental resistance by preventing the photosetting resin layer applied to the protective layer formed from nitride or sulphide from being removed with the lapse of time.

In manufacturing a magneto-optical recording medium according to the present invention to accomplish the aforesaid object, a recording layer is formed from a vertical magnetizing film made up of amorphous metal having a magnetization facilitating axis in a vertical direction on the basic material. A protective film layer with a metal or semi-metal oxide, nitride or sulphide as a chief ingredient is formed consecutively on the recording layer in the vacuum tank, and the surface energy of the protective film is raised by etching it with plasma, such that close adhesion to the photosetting resin layer is thereby improved.

In case the surface area of the material increases in a condition where its bulk is uniform, the surface energy increases generally, but it is lowered by absorption of outside material onto the surface.

Basing the present invention on such a principle, the protective layer of magneto-optical recording medium is etched with plasma and a photosetting resin which is not pervious to air and moisture is applied thereto. As a result, the close adhesion of the protective layer to the photosetting resin layer is strengthened and excellent environmental resistance is thereby obtained.

DETAILED DESCRIPTION OF THE PREFERRED EMBODIMENTS

Figure 1:
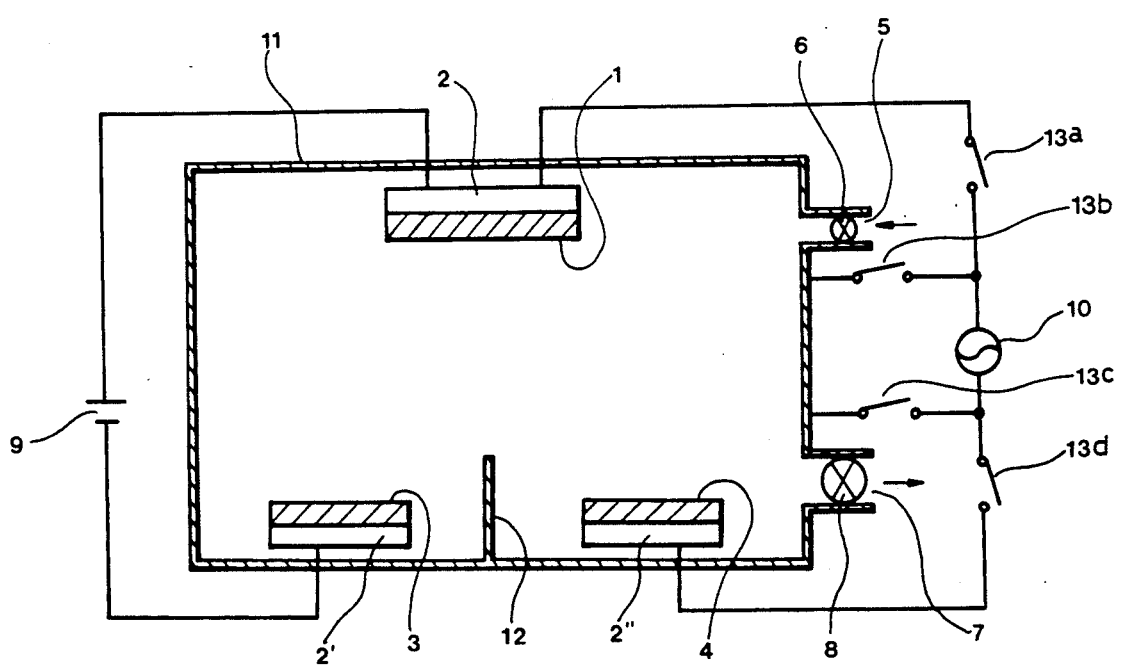
FIG. 1 is a schematic representation of the sputtering device which manufactures a magneto-optical recording medium according to the present invention.

A method for manufacturing a magneto-optical recording medium according to the present invention will hereinafter be described in detail by referring to the drawings attached hereto.

Figure 2:
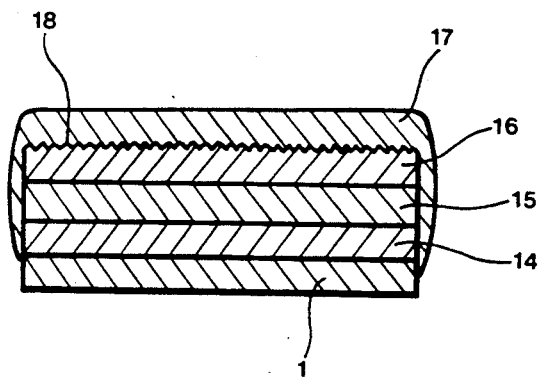
FIG. 2 is a sectional view of the magneto-optical recording medium of the present invention.

In FIG. 1, a circular polycarbonate substrate 1, targets comprising a TbFeCo alloy 3 and a nitride 4 are attached to respective metal electrodes 2, 2' and 2" and installed in the vacuum chamber 11. The air within the vacuum chamber 11 is exhausted through an exhaust port 7 connected with an outside vacuum pump at one end of said vacuum chamber 11. Argon is flowed into the vacuum chamber 11 through an argon inlet port 5 and the inner pressure of vacuum chamber 11 is thereby maintained at 1-8 mTorr. After switches 13b, 13d are closed to connect the metal electrode 2" attached to said nitride target 4 to the AC power source 10, electric power is supplied and the nitride target 4 is sputtered and a transparent nitride interfering layer 14 (see FIG. 2) with a thickness of 500-900 Å is thereby formed on the circular polycarbonate substrate 1. Negative (−) electric power is then supplied to the metal electrode 2' attached to the TbFeCo target from the DC power source 9 and the TbFeCo target 3 is sputtered. A photomagnetic recording layer 15 with a thickness of 400-1000 Å is thereby formed on the transparent interfering layer 14. The nitride target 4 is again sputtered and a nitride protective film layer 16 with a thickness of 600-1000 Å is thereby formed on the recording layer 15. After switches 13a, 13c are closed to connect the metal electrode 2 attached to the circular polycarbonate substrate 1 to the AC power source 10, electric power of 100-500 W is supplied, and the surface of said nitride protective film layer 16 is etched with argon plasma for 10-30 seconds and a rough surface 18 is thereby formed on the protective film layer 16. After the interfering layer 14, TbFeCo recording layer 15, and nitride protective film layer 16 are consecutively formed on the circular polycarbonate substrate 1, the product is taken out, a photosetting resin is applied thereto to a thickness of 30–80 μm in a spin coating process, whereby a photosetting resin layer 17 is formed. A magneto-optical recording medium having such a sectional construction as illustrated in FIG. 2 is thereby manufactured.

In the manufacturing process according to the present invention, the inner pressure of vacuum chamber 11 is controlled by regulating the opening and closing of gas flow valve 6 and vacuum exhaust valve 8. The TbFeCo alloy target 3 and nitride target 4 are kept from being contaminated by each other by installing a partition 12 in the vacuum chamber 11.

Figure 3:
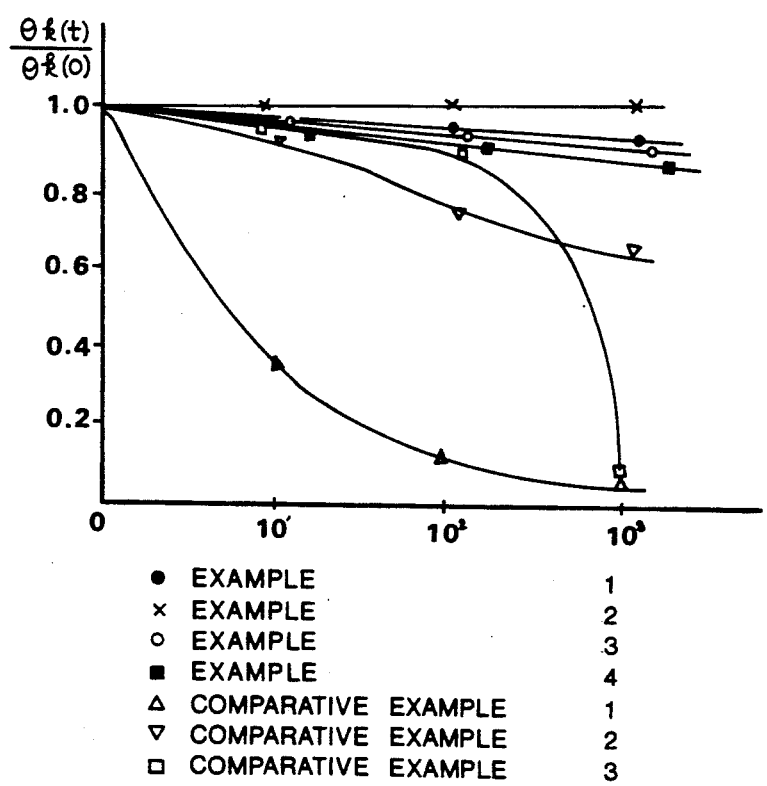
FIG. 3 is a graph showing a change in the Kerr angle of rotation after a conventional magneto-optical recording medium and the magneto-optical recording medium of the present invention are left alone.
Figure 4:
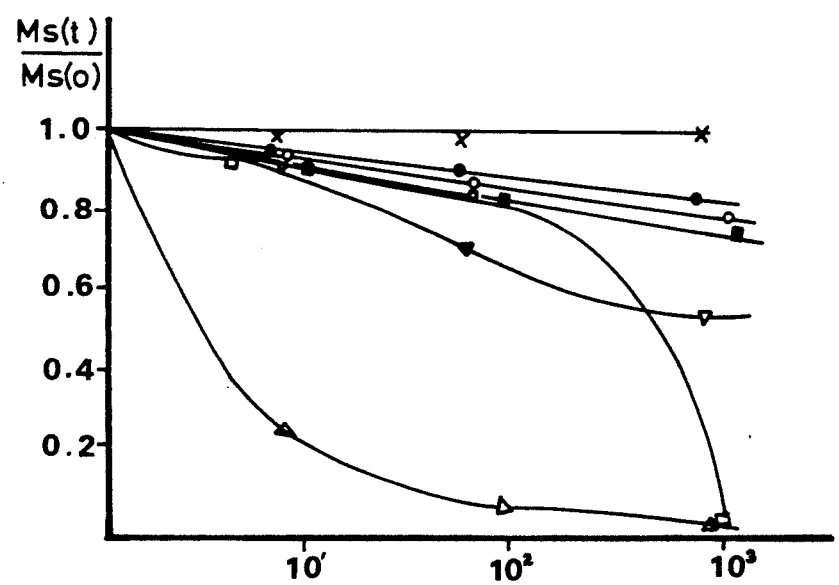
FIG. 4 is a graph showing a change in saturation magnetization amount caused after a conventional magneto-optical recording medium and a magneto-optical recording medium of the present invention are left alone.

FIG. 3 and FIG. 4 represent the rate of change of the Kerr angle of rotation and the saturation magnetization amount, with time, as measured by a magneto-optical measuring instrument and a vibrating magnetic force measuring instrument. The magneto-optical recording medium is left alone after it is put in a thermohygrostat with its temperature held at 80° C. and its relative humidity at 85%.

The rate of change is defined by: (the value of the physical properties measured after a period of time/the value of the physical properties measured at the initial stage).

COMPARATIVE EXAMPLE 1

A circular polycarbonate substrate is installed in the sputtering device. After air within the vacuum chamber is exhausted up to $7 \times 10^{-7}$ Torr, argon is injected into the chamber so that its inner pressure may be maintained at $5 \times 10^{-3}$ Torr, and an AlN target is sputtered by supplying electric power of 700 W thereto from the outside AC power source. A nitride interfering layer is thereby formed to a thickness of 800 Å on the circular substrate. Then, a 1000 Å-thick amorphous thin film recording layer composed so as to possess a recording characteristic is formed by sputtering a TbFeCo alloy, and a magneto-optical recording medium was prepared by forming an AlN nitride protective film layer in the same way as the interfering layer is formed.

EXAMPLE 1

After the process of the said Comparative Example 1, AC of 300 W is continuously supplied to the circular substrate from the outside AC power source in the aforesaid vacuum chamber and the surface of the nitride protective film layer is etched with argon plasma for 20 seconds.

After the magneto-optical recording medium, whose surface is improved qualitatively by etching with argon plasma, is taken out of the vacuum chamber, photosetting resin is uniformly spin-coated to a thickness of 50 μm and a photosetting resin layer is formed.

COMPARATIVE EXAMPLE 2

A magneto-optical recording medium having the same thin film structure as Comparative Example 1 was prepared by forming a nitride interfering layer and a protective film layer of $Si_3N_4$ in the same way as Comparative Example 1 was prepared.

EXAMPLE 2

The product is etched with argon plasma in the same way as Example 1, and a photosetting resin layer is formed.

EXAMPLE 3

A magneto-optical recording medium having the same thin film structure as Comparative Example 1 is prepared by forming a nitride interfering layer and a protective film layer of ZnS in the same way as Comparative Example 1 is prepared. The product is etched with argon plasma in the same way as Comparative Example 1, and a photosetting resin layer is formed.

EXAMPLE 4

A magneto-optical recording medium having the same thin film structure as Comparative Example 1 is prepared by forming a nitride interfering layer and a protective film layer of $SiO_2$ in the same way as Comparative Example 1 is prepared. The product is etched with argon plasma, and a photosetting resin layer is formed.

COMPARATIVE EXAMPLE 3

A magneto-optical recording medium having the same thin film structural layer and thickness as Comparative Example 1 is prepared. A photosetting resin is applied to the surface of the protective film layer to a thickness of 50 μm, without etching it with argon plasma, and a photosetting resin layer is formed.

A magneto-optical recording medium (Examples 1 to 4) manufactured according to the present invention is greatly improved as compared to a prior magneto-optical recording medium (Comparative Examples 1 and 2) without a photosetting resin layer, and as compared to a magneto-optical recording medium (Comparative Example 3) with a photosetting resin layer formed without etching the surface of its protective film layer with argon plasma, as can be ascertained from FIG. 3 and FIG. 4.

Particularly, the magneto-optical recording medium that is not etched with argon plasma (Comparative Example 3) is stripped of its photosetting resin layer with the lapse of 100 hours.

However, the magneto-optical recording medium manufactured according to the present invention is not stripped of its photosetting resin layer. This is evidence that the close adhesion of photosetting resin layer to the protective film layer is strengthened to a considerable degree.

Consequently, the present invention offers a very useful improvement in the use of a magneto-optical recording medium by providing a magneto-optical recording medium whose environmental resistance is greatly improved.

We claim:

1. A method for manufacturing a magneto-optical recording medium which performs data writing, erasing, and rewriting by means of light, comprising the sequential steps of:

placing into a vacuum chamber a polycarbonate substrate, a TbFeCo alloy, and a composition selected from at least one of the group consisting of metal and semi-metal oxides, nitrides, and sulphides;

exhausting any air from the vacuum chamber and maintaining pressure within the vacuum chamber at between about 1–8 mTorr by the injection of argon into the vacuum chamber;

forming an interfering layer to a thickness of about 500–900 Å on the substrate by sputtering composition;

forming a recording layer having a thickness of between about 400–1000 Å on the interfering layer by sputtering said TbFeCo alloy;

forming a protective film layer of a thickness between about 600–1000 Å on the recording layer by sputtering said composition;

roughening the surface of the protective film layer with an argon plasma produced by the application of between about 100–500 W of electric power; and, applying a photosetting resin layer of a thickness between about 30–80 μm on the protective film layer in a spin coating process.

* * * * *